United States Patent
Volz (10) Patent No.: US 9,735,777 B2
(45) Date of Patent: Aug. 15, 2017

(54) DISCONNECTION OF SOLAR MODULES (71) Applicant: Multi-Holding AG, Allschwil (CH)

(72) Inventor: Hubert Volz, Mulheim (DE)

(73) Assignee: MULTI-HOLDING AG, Allschwil (CH)

( * ) Notice: Subject to any disclaimer, the term of this patent is extended or adjusted under 35 U.S.C. 154(b) by 385 days.

(21) Appl. No.: 14/379,024

(22) PCT Filed: Feb. 15, 2013

(86) PCT No.: PCT/EP2013/053089
§ 371 (c)(1),
(2) Date: Aug. 15, 2014

(87) PCT Pub. No.: WO2013/121003
PCT Pub. Date: Aug. 22, 2013

(65) Prior Publication Data
US 2014/0375145 A1  Dec. 25, 2014

(30) Foreign Application Priority Data

Feb. 17, 2012  (EP) .................................. 12155952

(51) Int. Cl.
*H03K 17/94* (2006.01)
*H01L 31/02* (2006.01)
(Continued)

(52) U.S. Cl.
CPC ....... *H03K 17/94* (2013.01); *H01L 31/02021* (2013.01); *H01L 31/0504* (2013.01); *Y02E 10/50* (2013.01)

(58) Field of Classification Search
CPC .............. H03K 17/94; H01L 31/02021; H01L 31/0504; Y02E 10/50
(Continued)

(56) References Cited

U.S. PATENT DOCUMENTS

| 2003/0132221 A1 | 7/2003 | Lau et al. |
| 2009/0146505 A1 | 6/2009 | Powell et al. |
| 2010/0139734 A1 | 6/2010 | Hadar et al. |

FOREIGN PATENT DOCUMENTS

| CN | 1432330 | 7/2003 |
| CN | 101953048 | 1/2011 |
| WO | 2011/023732 A2 | 3/2011 |

OTHER PUBLICATIONS

International Preliminary Report on Patentability issued Aug. 19, 2014 in corresponding International Application No. PCT/EP2013/053089.
(Continued)

*Primary Examiner* — Hal Kaplan
(74) *Attorney, Agent, or Firm* — Wenderoth, Lind & Ponack, L.L.P.

(57) ABSTRACT

A method is provided for safely switching off a photovoltaic module comprising solar cell groups, a first conductor electrically connected to the solar cell groups, and a second conductor electrically connected to the solar cell groups. The safety device comprises at least one first safely switching element and one second safety switching element, wherein the safety switching elements are arranged in parallel across the solar cell groups and are connected to the first conductor and the second conductor in an electrically conductive manner. If an error state occurs, at least one of the safety switching elements is switched by means of a switching process, such that a shorted circuit is produced across the solar cell groups. The at least two safety switching elements perform the switching process in working areas that differ at least partially regarding the temperature.

22 Claims, 2 Drawing Sheets

(51) Int. Cl.
H01L 31/05 (2014.01)
H02H 11/00 (2006.01)
(58) Field of Classification Search
USPC .......................................... 307/326
See application file for complete search history.

(56) References Cited

OTHER PUBLICATIONS

International Search Report issued Nov. 13, 2013 in corresponding International Application No. PCT/EP2013/053089.

DISCONNECTION OF SOLAR MODULES

TECHNICAL FIELD

The present invention relates to a method for safe disconnection of a photovoltaic module in accordance with the embodiments below and to a corresponding device according to the embodiments below and a photovoltaic module according to the embodiments below.

PRIOR ART

When there is incident light, photovoltaic modules produce electrical energy and usually cannot be disconnected and pose a safety risk in the case of maintenance work and extinguishing work in the event of a fire.

Devices with which the photovoltaic module can be disconnected remotely manually or automatically are known from the prior art. Such systems have the disadvantage, however, that communication which is free from interference is required. Precisely in the case of a fire, however, interference immunity cannot be ensured.

Furthermore, particularly safe systems have the disadvantage that, in addition, control lines need to be laid, which is detrimental to the acceptance of these systems.

DESCRIPTION OF THE INVENTION

Against the background of this prior art, the invention is based upon the object of specifying a method in which the photovoltaic module can be brought into a safe mode or can be disconnected even in the event of a fire, in particular without any additional communication or control lines.

Such an object is achieved by the method discussed below. A method is used for safe disconnection of a photovoltaic module comprising at least one solar cell group, comprising a first conductor, which is electrically connected to the at least one solar cell group or solar cell groups, and comprising a second conductor, which is electrically connected to the at least one solar cell group or solar cell groups, wherein said conductors, via a connection device, conduct the voltage generated by the solar cell group or solar cell groups away out of the photovoltaic module. A solar cell group can comprise one or more solar cells. The safety apparatus comprises at least a first safety switching element and a second safety switching element, wherein the safety switching elements are arranged in parallel across the at least one solar cell group or the solar cell groups or a series of solar cell groups and are electrically conductively connected to the first conductor and the second conductor. In the event of the onset of a fault state, at least one of the safety switching elements is switched with a switching operation such that a short circuit is produced across the solar cell group or solar cell groups, as a result of which the solar cell group or solar cell groups are disconnected from the connection device. The at least two safety switching elements implement the switching operation in working ranges which, with respect to temperature, are at least partially different than one another. Preferably, the working ranges of the at least two safety switching elements partially overlap one another.

Owing to the fact that the switching operation is implemented at different temperatures, the photovoltaic module can be short-circuited up to high temperatures even in the event of failure of a safety switching element. Furthermore, the failsafety can be increased by the arrangement of a plurality of safety switching elements.

The fault state can be, for example, a predetermined temperature being exceeded, which temperature is detected by a corresponding element, such as a temperature-controlled switch.

The expression a series of solar cell groups should be understood to mean that at least two solar cell groups are connected in series and that the safety switching elements are in parallel with this group.

The method can of course be used for a single solar cell group and for a plurality of solar cell groups connected in series. The number of solar cell groups can be as desired.

Preferably, with respect to temperature, a defined working range is allocated to each of the safety switching elements, wherein the working ranges preferably partially overlap one another.

Preferably, the first safety switching element implements the switching operation up to a predetermined temperature, and the second safety switching element implements the switching operation above the predefined temperature, wherein the predefined temperature is preferably in the upper range of the working range of the first safety switching element. The expression upper range is intended to mean, by way of example, a range of greater than the average temperature in the corresponding working range.

Preferably, the safety switching elements implement said switching operation reversibly until a predefined limit temperature is reached, with the result that, in the event of discontinuation of the fault state, the safety switching elements are switched in such a way that said short circuit is interrupted.

Preferably, at least one of the switching elements implements the switching operation irreversibly in the event that a predefined limit temperature is exceeded, with the result that the short circuit is also present once the limit temperature has been undershot.

Preferably, at least one of the safety switching elements has the configuration of a semiconductor switching element, and at least one of the safety switching elements has the configuration of an electromechanical relay, wherein, below or up to a predetermined temperature, which is preferably below the maximum operating temperature of the semiconductor switching elements, said switching operation is ensured by all safety switching elements, while, above this maximum operating temperature of the semiconductor switching elements or the predetermined temperature, said switching operation is ensured by the electromechanical relay.

Preferably, the safety switching elements are designed in accordance with different physical principles with respect to the circuitry. This has the advantage that the failsafety in the case of any interference events can be further improved.

A safety device for implementing the method comprises at least a first safety switching element and a second safety switching element, wherein the safety switching elements are arranged in parallel across the at least one solar cell group or the solar cell groups and are electrically conductively connected to the first conductor and the second conductor, wherein, in the event of the onset of a fault state, at least one of the safety switching elements is switched with a switching operation, with the result that a short circuit can be produced across the at least one solar cell group or solar cell groups, wherein the switching operation can be implemented by the at least two safety switching elements in working ranges which, with respect to temperature, are at least partially different than one another.

Preferably, the safety device is accommodated in a junction box, which can be arranged on a photovoltaic module.

Further embodiments are specified below.

BRIEF DESCRIPTION OF THE DRAWINGS

Preferred embodiments of the invention will be described below with reference to the drawings, which are only used for illustrative purposes and should not be interpreted as being restrictive. In the drawings.

DESCRIPTION OF PREFERRED EMBODIMENTS

Figure 1:
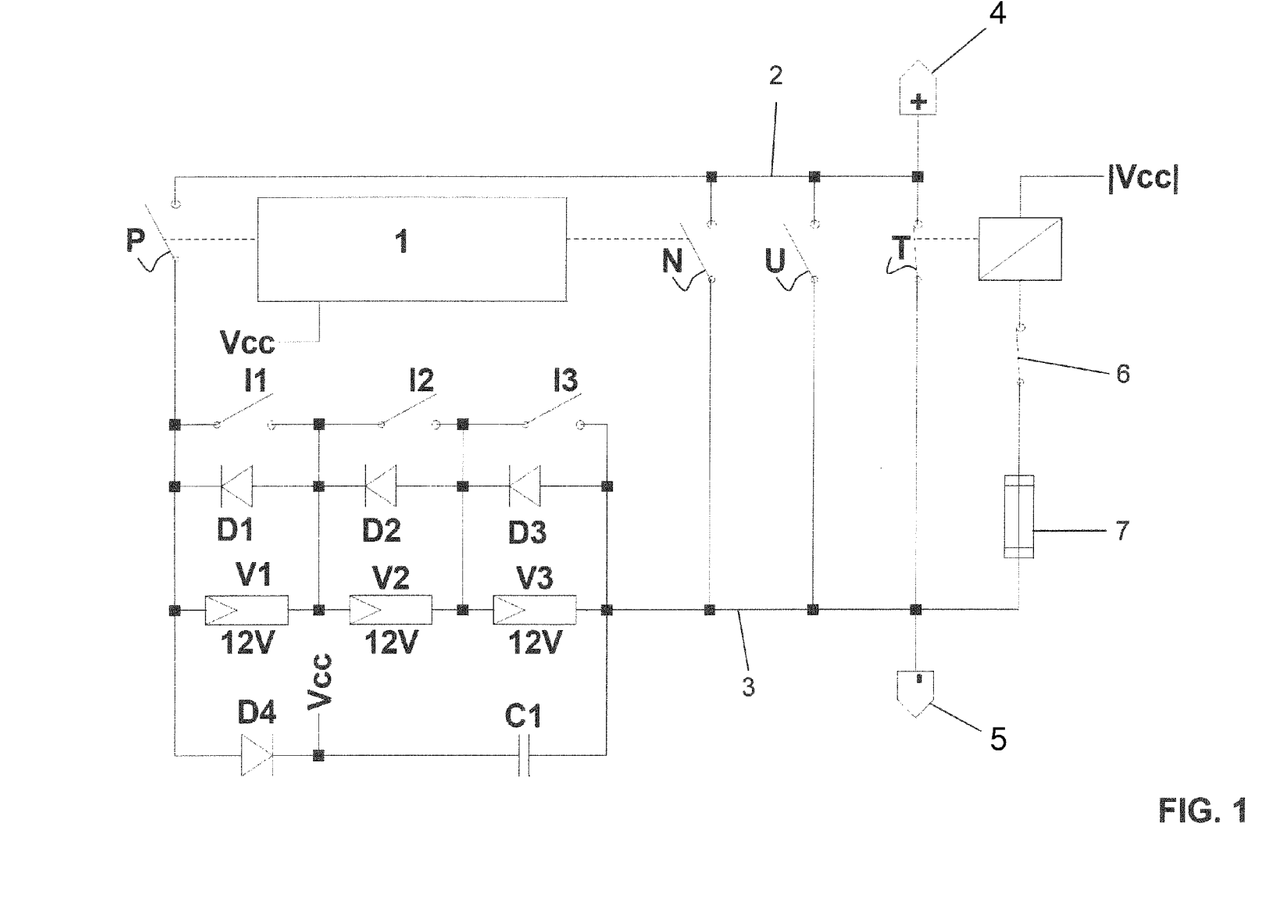
FIG. 1 shows an electrical circuit diagram of a safety device for safe disconnection of a photovoltaic module in accordance with an embodiment of the present invention.

FIG. 1 shows an electrical circuit diagram of a safety device for safe disconnection of a photovoltaic module in accordance with one embodiment of the present invention. This safety device shown in FIG. 1 can be operated in accordance with a method according to the invention. However, it should be noted that the method according to the invention described below can also be implemented using other safety devices.

In the present embodiment, the photovoltaic module comprises at least one solar cell group V1. In this case, three solar cell groups V1, V2 and V3 are arranged. The number of solar cell groups arranged is irrelevant for the invention, however. In each case one bypass diode or freewheeling diode D1, D2, D3 arranged in parallel with the respective solar cell group V1, V2, V3 is located across each of the solar cell groups V1, V2, V3. Furthermore, in each case one switching element I1, I2, I3 is arranged in parallel with the respective solar cell group V1, V2, V3 or with the respective bypass diode D1, D2, D3. The bypass diode D1, D2, D3 and the switching element I1, I2, I3 serve to bring individual solar cell groups out of operation in the event of a fault.

Furthermore, the safety device comprises a controller 1, which is supplied an auxiliary voltage Vcc. The controller 1 is used substantially to control the two switches P and N during normal operation, as will be explained below. The auxiliary voltage Vcc is preferably generated by at least one of the solar cell groups V1, V2, V3 and the diode D4 and the capacitor C1 themselves.

In the preferred embodiment of the voltage supply, the switch P reduces the short-circuit current flowing through the short circuit (U, T) in order to obtain the internal voltage Vcc and can also completely disconnect said short-circuit current with suitable driving by means of the control circuit 1. As a result, the solar module is both short-circuited externally and interrupted internally. The switch P is advantageous for obtaining the voltage supply Vcc in some operating modes of the module unless Vcc is generated in another way.

The circuit or the photovoltaic module further comprises a first conductor 2, which is electrically connected to the solar cell groups, and a second conductor 3, which is electrically conductively connected to the solar cell groups. Said conductors 2, 3 conduct, via a connection device 4, 5, the voltage generated by the solar cell groups V1, V2, V3 away out of the photovoltaic module. Consequently, the first conductor 2 and the second conductor 3 are connected to electrical consumers via a connection device. The two conductors 2, 3 can be brought into contact with external electrically conducting elements, such as with a cable which leads to the grid or to the consumers, via connections 4 and 5. The first conductor 2 in this case represents the positive terminal and the second conductor 3 represents the negative terminal.

The safety circuit comprises at least a first safety switching element and a second safety switching element. In the present embodiment, the switch U represents the first safety switching element and the switch T represents the second safety switching element. The safety switching elements U, T are arranged in parallel across the solar cell groups V1, V2, V3 and are electrically conductively connected to the first conductor 2 and the second conductor 3. At least one of these switching elements is switched in the fault state, with the result that a short circuit is produced across the solar cell groups V1, V2, V3, as a result of which said connections 4 and 5 and the external electrically conducting elements, which are connected to the connections, are no longer supplied electrical energy, as a result of which the photovoltaic module is in a safe state.

By virtue of at least two safety switching elements U, T being arranged, the safety devices are present in multiple form and, in the event of failure of one of the safety-relevant safety switching elements U, T, other safety switching elements take over the task of safe disconnection of the solar cell groups V1, V2, V3. If, therefore, the safety switching element U fails, the safety switching element T can take over the switching.

The safety circuit shown in FIG. 1 is arranged in the region of the photovoltaic module. Preferably, the safety circuit is arranged in a junction box or else directly in the photovoltaic module itself, i.e., for example, in a frame of the photovoltaic module. Consequently, therefore, there are no safety-relevant control lines at locations remote from the photovoltaic module.

With the circuit or safety circuit shown in FIG. 1, it is possible to control the photovoltaic module in a variety of ways. In principle, a distinction is drawn between normal operation and emergency operation in the event of the presence of a fault state.

The expression normal operation is understood to mean normal operation for generating electrical energy. Generally, the photovoltaic module is in a temperature range of from −50° C. to 85° C. during normal operation. However, the temperature may also be higher, for example up to 175° C. In this case, the temperature range is substantially within the permitted operating temperature range of the electronic components provided in the safety circuit. With respect to temperature, it should be noted here that the temperature is the temperature in the region of the safety circuit, i.e. in the region of the photovoltaic module.

Normal operation transfers to emergency operation or fault-case operation as soon as fault states or special circumstances, such as a fire or a development of heat in the region of the photovoltaic module or the controller, for example, require this. Emergency operation or the fault state generally sets in before or when said temperature exceeds the permitted operating temperature of the electronics. If the operating temperature exceeds the maximum temperature of the electronics, the module is kept in a short-circuited state by a safety switching element T, which is sufficiently dimensioned with respect to temperature, up until destruction when a maximum temperature is exceeded. The expression self-destruction is in this case understood to mean that the module is destroyed correspondingly owing to the development of heat in the event of a fire, in which case, for example, there may be glass breakage or the cell connectors may become unsoldered.

During fault-case operation or during emergency operation, i.e. in the event of the onset of a fault state, at least one of the safety switching elements U, T is switched, with the result that a short circuit is produced across the solar cell groups V1, V2, V3. The at least two safety switching elements U, T implement the switching operation in different working ranges with respect to temperature.

Figure 2:
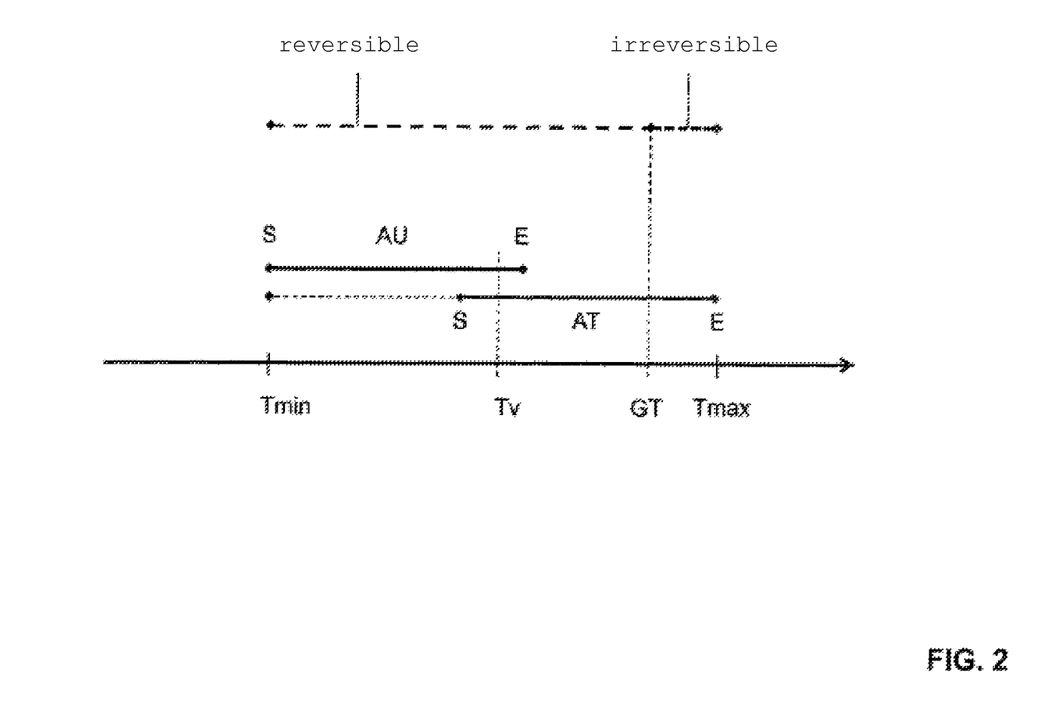
FIG. 2 shows a schematic illustration of different working ranges of safety switching elements which can be used in the safety device as shown in FIG. 1.

FIG. 2 shows that each of the safety switching elements U, T has, with respect to temperature, a working range which is allocated to the switching element. A working range AU is allocated to the safety switching element U, and a working range AT is allocated to the safety switching element T. Each of the working ranges AU and AT has in this case a start point S and an end point E. The working ranges AU and AT are in this case selected such that they extend from a predefined minimum temperature $T_{min}$ up to a predefined maximum temperature $T_{max}$. Consequently, the start point S of the working range AU is in the region of the minimum temperature $T_{min}$, and the end point E of the working range AT is in the region of the maximum temperature $T_{max}$.

In this case, the safety switching elements U, T are designed in such a way that at least one of the safety switching elements U, T has a corresponding working range AU, AT over the entire temperature range from a minimum temperature $T_{min}$ up to a maximum temperature $T_{max}$.

The working ranges AU and AT are preferably such that they partially overlap one another. This ensures that, given any temperature, always at least one of the switching elements P, N, U, T is in its working range. In this region of overlap, a certain redundancy between the safety switching elements P, N, U, T is thus provided. The working range of the switch T can also extend over the entire use range, i.e. from $T_{min}$ to $T_{max}$, however. The switch T is preferably embodied as an electromechanical relay because the upper operating temperature of such an electromechanical relay is above the upper operating temperature of semiconductor switches. Other switching elements for the use as switch T are also conceivable, however.

In other words, it can also be said that, below a predetermined temperature Tv, the safety or the switching of the short circuit is ensured by all safety switching elements P, N, U, T, while above this predetermined temperature Tv, which is preferably below the maximum operating temperature of the semiconductors, the safety or switching of the short circuit is only ensured by one or more specific other safety switching element(s) T.

This predetermined temperature Tv is preferably approximately 85° C., i.e. still in the range of the operating temperature of the electronics. The predetermined temperature Tv can also be higher or lower, however.

Preferably, one of the safety switching elements, in this case the safety switching element T or the second safety switching element T, implements the switching operation in the event that a predefined temperature Tv is exceeded. Preferably, the predefined temperature Tv is in the working range of the other switching elements P, N and U. In the event of a fire, i.e. during fault-case operation, the situation can therefore occur whereby, owing to the development of heat from the fire, one safety switching element U is no longer operational since the temperature is already above the working range AU of the corresponding safety switching element U. Thus, the maximum temperature range to be covered is increased by the arrangement of the additional safety element T, as a result of which the photovoltaic module can still safely be disconnected even in the case of high temperatures.

In the present embodiment, the safety switching element U has the configuration of a semiconductor switching element U. The other safety switching element T in this case has the configuration of an electromechanical relay T. The two safety switching elements U, T are in this case arranged in parallel with one another. It is also possible for two semiconductor switching elements N and U to be arranged in parallel with one another. Below or up to a predetermined temperature Tv, which is below the maximum operating temperature of the semiconductor switching elements U, said switching operation is preferably ensured by all of the safety switching elements P, N, U, T. Above this maximum operating temperature of the semiconductor switching elements U, said switching operation is ensured by the electromechanical relay T. Consequently, the working range AU of the semiconductor switching element extends from the lower end point up to this maximum operating temperature, and the working range AT of the relay T extends from the lower end point up to a maximum temperature $T_{max}$, which is above the maximum operating temperature of the semiconductor switching elements U. The predetermined temperature Tv above which the switching operation is ensured by the relay is therefore preferably within the working range AU of the semiconductor switching elements.

The safety switching element T is preferably in the form of a normally closed contact, with the result that it remains in the closed state in the quiescent state and therefore provides the short circuit across the photovoltaic module. Thus, the solar module can only be switched on when at least the safety switching element T is usable. Consequently, the operational safety can in this case be increased further.

The functions of the safety switching elements U, T will be explained in more detail below with reference to the semiconductor switching element U and the electromechanical relay T. In this context, it should be noted that the semiconductor switching element U and the electromechanical relay T are advantageous embodiments. However, it is also possible for other safety switching elements with similar functions and properties to be used. It is important, however, that the two safety switching elements have working ranges above different temperatures.

Preferably, the safety switching elements are designed in accordance with different physical principles in respect of switching. For example, the safety switching element U with the configuration of a semiconductor switching element implements the switching operation in a temperature range or working range of −40° C. to 100° C. The above mentioned predetermined temperature Tv is preferably in a range of from 60° C. to 100° C., in particular in a range of from 60° C. to 85° C. The safety switching element T with the configuration of an electromechanical relay, on the other hand, implements the switching operation in a temperature range or a working range of from −50° C. up to a range of from 300° C. to 500° C., preferably 450° C. Consequently, therefore, increased safety can be provided with the arrangement of at least two safety switching elements which have different working ranges with respect to temperature. In particular, however, a safety circuit can be specified which short-circuits the photovoltaic module safely even in the event of a fire, with the result that no risks in respect of electric shock emerge from the photovoltaic module.

In other words, it can also be said that the protection concept comprising a combination of different electronic and electromechanical switches increases safety owing to the use of different physical principles and the multiple use thereof. Consequently, the safety of the installation is increased overall.

Particularly preferably, at least one electromechanical relay and a plurality of semiconductor switches are provided as safety switching elements.

The safety switching element U with the configuration of the semiconductor switch can be driven differently. The safety switching element U can be triggered in the event of an overvoltage, for example, as described below. The safety switching element U can be driven similarly to phase-gating control, for example.

The electromechanical relay T can be driven differently. The electromechanical relay T is in this case supplied and kept open by means of an auxiliary voltage Vcc. As soon as there is a drop in the auxiliary voltage Vcc, the switch T closes, with the result that the photovoltaic module or the solar cell groups V1, V2, V3 is/are correspondingly short-circuited. In the initial position, the electromechanical relay T is therefore in the closed state, as a result of which the generation of the auxiliary voltage is not safety-relevant. When the auxiliary voltage is applied, the relay T opens and the short circuit across the module is canceled. If the auxiliary voltage Vcc is not present, the electromechanical relay drops out, and the photovoltaic module is short-circuited in the safe state. The safety concept described herein makes it possible for the module to be short-circuited and therefore to be safe in the event of overheating, in the event of failure of the control electronics or the power semiconductors or in the event of an internal arc in the junction box or any malfunction of the electronic controller 1.

In the present exemplary embodiment, in addition a temperature-controlled auxiliary switch 6 is provided, which controls the electromechanical relay T correspondingly. As soon as the temperature in the region of the auxiliary switch 6 increases to above said predefined temperature Tv, the auxiliary switch 6 opens, as a result of which the electromechanical relay T, to which the auxiliary voltage Vcc is applied prior to opening of the auxiliary switch 6, likewise closes.

As soon as the temperature then reduces to below the temperature Tv again, the auxiliary switch 6 closes again, as result of which the electromechanical relay T opens again. A reversible switching operation is thus made possible.

The auxiliary switch 6 is, for example, a PTC thermistor or a material in the magnetic core of the relay which allows the relay to drop out when the Curie temperature is reached. In this case, the Curie temperature substantially corresponds to the predetermined temperature Tv.

Furthermore, the safety device can additionally comprise an optional thermal link 7. The thermal link 7 is in this case arranged in series with the auxiliary switch 6. The thermal link 7 is used substantially for irreversible disconnection of the photovoltaic module as soon as the temperature acting on the photovoltaic module has exceeded a predetermined limit temperature GT. The limit temperature GT can be, for example, less than 130° C. As soon as the effective temperature has exceeded 130° C., therefore, the thermal link 7 is destroyed. Therefore, the electromechanical relay T is no longer supplied the auxiliary voltage Vcc, as a result of which the relay T closes correspondingly and short-circuits the solar cell groups. Even once the limit temperature GT has been undershot, the safety switching element 6 remains in the closed position, i.e. in the conducting state, as a result of which the short circuit continues. The installation can no longer be brought into operation directly without any maintenance by a person skilled in the art.

Owing to this safety concept with the temperature-controlled auxiliary switch 6 and the optional thermal link 7, it is therefore ensured that, in the event of failure of the control electronics, in particular the semiconductor switches P, N, U, the photovoltaic module can be disconnected safely, wherein the disconnection takes place once a predetermined temperature Tv is exceeded. The switches P, N, U can also be referred to as isolating devices. The disconnection takes place reversibly up to a specific limit temperature GT and irreversibly once the limit temperature has been exceeded.

The quiescent state of the safety switching element T is closed. Consequently, when the auxiliary voltage Vcc is applied, the safety switching element T is opened and, when the auxiliary voltage Vcc is discontinued, it is closed again correspondingly. The auxiliary voltage Vcc can be discontinued for various reasons, for example as a result of failure of the controller, by opening the temperature switch 6 or by failure of the thermal link 7.

The safety switching element U can be in the form of a switch which trips in the event of an overvoltage, for example. Such a switch both protects the safety circuit from overvoltage and protects the solar module from impermissibly high reverse currents and internal arcs, for example as a result of connector breakage. In the case of an internal arc, the module voltage increases by approximately 12 V and is therefore above the open circuit voltage. Even a high reverse current increases the module voltage to above the open circuit voltage and can therefore be evaluated in the same way. The preferred embodiment of the switch U is a triac or a thyristor. If the switch U becomes conducting, it remains conducting and thus has the same response as a latching relay. If the switch U becomes too hot, the safety switch T protects the switch U and drives the module into the safe short-circuit state, as described above. The temperature of the switch U is monitored or detected correspondingly by the auxiliary switch 6, wherein exceeding of said predetermined temperature Tv, the auxiliary switch 6 switches correspondingly and therefore closes the relay T.

With the circuit shown herein, the photovoltaic module can be operated in particular in the following operating modes:

Bypass Operation with Full Shadowing

If the switch P interrupts the current, a bypass for the current to other modules then needs to be provided. The switch P interrupts the current, with the result that the auxiliary voltage Vcc is maintained. For this, firstly the switch N is used, which is preferably in the form of an N-MOSFET. Even in the event of no driving, this semiconductor switch would then allow the bypass current to pass through. If the switch N is interrupted, the voltage-triggered switch U then becomes conducting, said switch U being embodied as a triac for this purpose. Should the switch U also fail, the switch T takes over.

Bypass Operation with Partial Shadowing

If the module is subjected to only partial shadowing, the switch P remains conducting, and the switch N remains off. Since an auxiliary voltage Vcc is generated internally, it is possible to bridge the bypass diodes with current-direction-controlled switches I1, I2, I3. As a result, the temperature in the junction box decreases and the current yield increases owing to the reduction in the diode forward losses.

Safe Switch-on

For starting, a direct current or alternatively an alternating current can be provided to the connections "positive" and "negative" from outside the photovoltaic module. Only when the installation was previously free of direct current is the short circuit canceled by the switch T, when the control electronics are operating (self-testing of the control electronics, the power semiconductors and the bypass diodes), and the switches U, N and P are switched so as to be conducting by the control electronics. Owing to starting in the voltage-free state, the relay contacts are spared and it is ensured that the AC voltage required for the start sequence does not originate from an arc or a faulty inverter.

In addition, module starting is also possible as a result of a communication signal since the control electronics are equipped correspondingly in any operating mode.

Active PV Module Protection

By virtue of the self-tripping of the switch U in the event of an overvoltage, there is a certain degree of overvoltage protection for the circuit, the solar cell groups and also for the bypass diodes D1, D2, D3.

The solar cell groups can be relieved of load or disconnected electrically by the three short-circuit channels N, U and T both during bypass operation and during reverse-current operation. This results for the first time in active self-protection for solar cell groups, which can also be initiated by an excess temperature of the module.

Normal Operation

During normal operation, the switch P is conducting, i.e. closed, and the rest of the switches N, U and T are non-conducting, i.e. open.

Reverse-Current Operation

During reverse-current operation, the switches N, U and T are non-conducting, i.e. open. In the preferred embodiment of switch P as a P-MOSFET, it is irrelevant whether switch P is open or conducting since the body diode integrated in this semiconductor switch becomes conducting. Additional driving of switch P reduces the waste heat of switch P. In the event of a large overcurrent, the current can be redirected via switch N or, in serious cases, via switch U, which is equivalent to active photovoltaic module protection. If the switches P, N, U become too hot, the safety switch T again takes over.

Bypass Operation

During bypass operation, switches U and T are non-conducting, i.e. open. Optionally, the bypass current can flow via switch P or else via switch N. In the case of a large overcurrent, switch U can be initiated, which takes place automatically in the case of a very large overcurrent.

Function of the Bypass Diodes

The bypass diodes D1, D2, D3 can be dispensed with given corresponding driving of switches P and N. The current yield is greater when using additional bypass diodes, however. The components I1, I2, I3 can in the simplest case be embodied as diodes, as MOSFET switches (functionally as a smart bypass diode) or in conjunction with interconnected complex impedances as charge pump or switched-mode power supply.

The use of MOSFETs is possible since an auxiliary voltage needs to be generated anyway for the driving of switch N, and it would then also be possible to use this auxiliary voltage for driving D1, D2, D3. This solution is in total less expensive than the use of special cool bypass switches or smart bypass diodes available on the market because these components need to generate the auxiliary voltage internally separately and individually, while the above-described circuit would operate uninterrupted.

Hardware Self-Test

The photovoltaic module is interrupted in the quiescent state and the connections 2 (positive terminal) and 3 (negative terminal) are short-circuited via the safety switching element T. Owing to the type of circuit, it is ensured that the safety-relevant components of the control electronics and the power semiconductors P, N, U need to function properly before the photovoltaic module outputs voltage to the outside. Furthermore, the operation of the bypass diodes D1, D2, D3 can also be tested by the circuit, which then goes beyond conventional PV module monitoring.

Monitoring

Since temperature, currents and voltages are detected by the control electronics, the module voltage, module current and module temperature can be passed on via a communications channel.

Preferred Communication During Normal Operation

The communication can be implemented as follows, for example:

Transmission
a) by means of an auxiliary current via MOSFET N
b) by means of current limitation via MOSFET P Reception
a) by means of sampling the module current via current sensor resistors
b) by means of sampling the module voltage Uo Preferred Communication During Short-Circuit Operation Precautionary Measure:
Initiate switch U for voltage limitation and open relay T(2)

Transmission
a) by means of an auxiliary current via MOSFET N
b) by means of current limitation via MOSFET P Reception
a) by means of sampling the module current via current sensor resistors
b) by means of sampling the module voltage Uo Disconnection of the Entire PV Generator by Means of a Fault Message in an Individual PV Module In the event of a local fire in an extended solar system, first only a few solar modules are overheated. In order to extinguish the system, however, it is necessary for the entire system to be disconnected from the power supply. The overheated module is disconnected and this causes a rapid and severe drop in the string voltage on the string line. This voltage drop can be used as trigger signal for the disconnection of all the remaining modules. Naturally, the disconnection command can also take place via a communication signal, which in this case is distributed by the disconnecting safety device or another device of the PV system.

Arc Detection

Owing to the possibility of monitoring AC signals both for the module voltage and for the module current, it is possible in principle to implement arc detection. In particular when using a microprocessor in the control electronics, hardware arc detection can be replaced by a software routine. Module-internal or junction-box internal arcs are detected by the circuit and quenched. The following principles are conceivable:
1. Detection by AC oscillations
2. Voltage increase in the module voltage
3. Temperature increase in the junction box
4. The sum of the module voltages needs to be equal to the string voltage.

Optional: Polarity Reverser

Conventionally, the solar cell groups of a module are connected permanently in series. If the solar cell groups of a module are galvanically isolated from one another and, in the same number, are passed to the outside, there are the following additional operating modes:

Connection of the solar cell groups back-to-back in series. This reduces the module voltage to zero volt and the current loading of the safety switches T, U and of the semiconductor switch is reduced considerably.

Connection of both solar cell groups back-to-back in parallel. This corresponds to a module short circuit with the output voltage zero. In this case, too, the current loading of the safety switches is considerably reduced.

Connection of both solar cell groups in parallel with half the maximum output voltage either in the positive or negative direction.

Connection of all of the solar cell groups in series either in the positive or negative direction with maximum output voltage.

By virtue of a suitable time sequence for the operating states, the PV module is now capable of producing alternating current. This reduces the risk of arcs in the system and, in the case of island applications, can drive a transformer directly. This alternating current is not sinusoidal, but is sufficient for simple applications. The above-described circuit needs to be modified for AC operation.

When the solar cell groups V1 to V3 are connected in parallel, the module current can be increased in the case of partial shadowing to such an extent that the bypass diodes are subjected to considerably less loading or even become functionally superfluous.

LIST OF REFERENCE SYMBOLS

1 Control electronics
2 First conductor
3 Second conductor
4 Connections
5 Connections
6 Temperature-controlled auxiliary switch
7 Thermal link
V1 Solar cell group
V2 Solar cell group
V3 Solar cell group
D1 Bypass diodes
D2 Bypass diodes
D3 Bypass diodes
I1 Semiconductor switch
I2 Semiconductor switch
I3 Semiconductor switch
N Semiconductor switch
U Semiconductor switch
T Temperature-controlled switch
P Semiconductor switch
Vcc Auxiliary voltage

The invention claimed is:

1. A method for safe disconnection of a photovoltaic module comprising at least one solar cell group wherein a first conductor, and a second conductor are each associated with the photovoltaic module and electrically connected to the at least one solar cell group, wherein the first conductor and the second conductor, via a connection device associated with the photovoltaic module, conduct the voltage generated by the at least one solar cell group away out of the photovoltaic module, the method comprising:
using a safety device that comprises at least a first safety switching element and a second safety switching element, wherein the at least the first safety switching element and the second safety switching element are arranged in parallel across the at least one solar cell group and are electrically conductively connected to the first conductor and the second conductor,
switching, in an event of an onset of a fault state, at least one of the at least the first safety switching element and the second safety switching element with a switching operation such that a short circuit is produced across the at least one solar cell group, such that the at least one solar cell group is disconnected from the connection device, and
implementing, with the at least the first safety switching element and the second safety switching element, the switching operation in working ranges which, with respect to temperature, partially overlap one another and are at least partially different than one another.

2. The method as claimed in claim 1, further comprising, allocating, with respect to the temperature, one defined working range of the working ranges to each of the first safety switching element and the second safety switching element.

3. The method as claimed in claim 1, further comprising implementing, with the first safety switching element, the switching operation up to a predetermined temperature, and implementing, with the second safety switching element, the switching operation above the predetermined temperature.

4. The device as claimed in claim 3, wherein the predetermined temperature is in an upper range of a working range, of the working ranges, of the first safety switching element.

5. The method as claimed in claim 1, further comprising implementing, with the at least the first safety switching element and the second safety switching element, the switching operation reversibly until a predefined limit temperature is reached, such that, in an event of discontinuation of the fault state, the at least the first safety switching element and the second safety switching element are switched in such a way that the short circuit is interrupted.

6. The method as claimed in claim 1, further comprising implementing, with at least one of the at least the first safety switching element and the second safety switching element, the switching operation irreversibly in an event that a predefined limit temperature is exceeded, such that the short circuit is present once the predefined limit temperature has been undershot.

7. The method as claimed in claim 1, wherein at least one of the at least the first safety switching element and the second safety switching element has a configuration of a semiconductor switching element, and the other of the at least the first safety switching element and the second safety switching element has a configuration of an electromechanical relay, wherein, below or up to a predetermined temperature, the switching operation is implemented by switching of all of the at least the first safety switching element and the second safety switching element, while, above the predetermined temperature or above a maximum operating temperature of the semiconductor switching element, the switching operation is implemented by switching of the electromechanical relay.

8. The device as claimed in claim 7, wherein the predetermined temperature is below the maximum operating temperature of the semiconductor switching element.

9. The method as claimed in claim 1, wherein the at least the first safety switching element and the second safety switching element are different types of safety switching elements.

10. The method as claimed in claim 1, wherein the safety device further comprises an isolating device, which is arranged in series with the at least one solar cell group and which can be operated such that the at least one solar cell group is disconnected from the connection device.

11. A safety device, the safety device comprising:
at least a first safety switching element and a second safety switching element, wherein the at least the first safety switching element and the second safety switching element are arranged in parallel across at least one solar cell group and are electrically conductively connected to a first conductor and a second conductor, each of the first conductor and the second conductor being associated with the safety device,
wherein, in an event of an onset of a fault state, at least one of the at least the first safety switching element and the second safety switching element is switched with a switching operation, such that a short circuit can be produced across the at least one solar cell group, and
wherein the switching operation is implemented by the at least the first safety switching element and the second safety switching element in working ranges which, with respect to temperature, partially overlap one another and are at least partially different than one another.

12. The safety device as claimed in claim 11, wherein, with respect to the temperature, one defined working range of the working ranges is allocated to each of the at least the first safety switching element and the second safety switching element.

13. The safety device as claimed in claim 11, wherein one of the at least the first safety switching element and the second safety switching element implements the switching operation in an event that a predefined temperature is exceeded, wherein the predefined temperature is outside a working range, of the working ranges, of the other of the at least the first safety switching element and the second safety switching element.

14. The device as claimed in claim 13, wherein the predefined temperature is above a working range, of the working ranges, of the second safety switching element.

15. The device as claimed in claim 11, wherein the at least the first safety switching element and the second safety switching element implement the switching operation reversibly until a predefined limit temperature is reached, such that, in an event of discontinuation of the fault state, the at least the first safety switching element and the second safety switching element are switched in such a way that the short circuit is interrupted, or such that at least one of the at least the first safety switching element and the second safety switching element implements the switching operation irreversibly in an event that the predefined limit temperature is exceeded, such that the short circuit is present once the predefined limit temperature has been undershot.

16. The device as claimed in claim 11, wherein one of the at least the first safety switching element and the second safety switching element is a semiconductor switching element, which implements the switching operation in a temperature range of from −50° C. to 175° C., and the other of the at least the first switching element and the second safety switching element is an electromechanical relay, which implements the switching operation in a temperature range from −50° C. to 500° C.

17. The device as claimed in claim 16, wherein the temperature range with respect to the semiconductor switching element ranges up to 125° C., or up to 85° C.

18. The device as claimed in claim 11, wherein at least one of the at least the first safety switching element and the second safety switching element has a configuration of a semiconductor switching element, and that the other of the at least of the first safety switching element and the second safety switching element has a configuration of an electromechanical relay, wherein, below or up to a predetermined temperature, which is below a maximum operating temperature of the semiconductor switching element, the switching operation is implemented by switching of all of the at least the first safety switching element and the second safety switching element, while, above the maximum operating temperature of the semiconductor switching element, the switching operation is implemented by switching of the electromechanical relay.

19. The device as claimed in claim 11, wherein the at least the first safety switching element and the second safety switching element are different types of safety switching elements.

20. The device as claimed in claim 11, wherein the safety device further comprises an isolating device, which is arranged in parallel across the at least one solar cell group, and which can be operated such that a short circuit is produced across the at least one solar cell group, such that the at least one solar cell group is disconnected from a connection device associated with the safety device.

21. A photovoltaic module for generating electrical energy comprising the at least one solar cell group, the first conductor and the second conductor each of the first conductor and the second conductor being electrically connected to the at least one solar cell group, wherein the first conductor and the second conductor are connected to electrical consumers via a connection device associated with the photovoltaic module and wherein the photovoltaic module further comprises a junction box, in which the safety device as claimed in claim 11 is arranged.

22. The device as claimed in claim 11, wherein the safety device further comprises an isolating device, which is arranged in series with the at least one solar cell group and which can be operated such that the at least one solar cell group is disconnected from a connection device associated with the safety device.

* * * * *